United States Patent
Shrivastava et al.

(10) Patent No.: US 11,863,360 B2
(45) Date of Patent: Jan. 2, 2024

(54) METHODS AND APPARATUS TO REDUCE VARIATIONS FOR ON-OFF KEYING TRANSMISSIONS

(71) Applicant: Texas Instruments Incorporated, Dallas, TX (US)

(72) Inventors: Kumar Anurag Shrivastava, Bangalore (IN); Siraj Akhtar, Richardson, TX (US); Swaminathan Sankaran, Allen, TX (US); Anant Shankar Kamath, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/584,099

(22) Filed: Jan. 25, 2022

(65) Prior Publication Data
US 2023/0308323 A1 Sep. 28, 2023

(51) Int. Cl.
*H03C 1/06* (2006.01)
*H03C 1/36* (2006.01)
*H04L 27/04* (2006.01)

(52) U.S. Cl.
CPC .............. *H04L 27/04* (2013.01); *H03C 1/06* (2013.01); *H03C 1/36* (2013.01)

(58) Field of Classification Search
CPC ... H03C 1/00; H03C 1/02; H03C 1/06; H03C 1/36; H04L 27/04
See application file for complete search history.

(56) References Cited

U.S. PATENT DOCUMENTS

| | | | | |
|---|---|---|---|---|
| 6,087,904 | A * | 7/2000 | Wen | H03C 1/36 332/149 |
| 6,292,067 | B1 * | 9/2001 | Sasabata | H04L 27/04 332/149 |
| 2004/0132417 | A1 * | 7/2004 | Maeda | H04L 27/367 455/108 |
| 2010/0102895 | A1 * | 4/2010 | Beukema | H04L 27/206 332/100 |
| 2013/0251067 | A1 * | 9/2013 | Fujimoto | H04L 27/04 375/300 |
| 2014/0044157 | A1 * | 2/2014 | Chang | G06F 15/7842 375/257 |
| 2015/0256369 | A1 * | 9/2015 | Park | H03K 7/02 332/116 |
| 2018/0358995 | A1 * | 12/2018 | Wang | H01Q 9/42 |
| 2019/0103838 | A1 * | 4/2019 | Kawasaki | H03D 7/1458 |
| 2022/0109591 | A1 * | 4/2022 | Jany | H03B 5/1228 |

* cited by examiner

*Primary Examiner* — Levi Gannon
(74) *Attorney, Agent, or Firm* — Valerie M. Davis; Frank D. Cimino

(57) ABSTRACT

An example apparatus includes: an on-off keying (OOK) modulator including: a first transistor including a first control terminal; a second transistor including a first current terminal, a second current terminal, and a second control terminal, the first current terminal coupled to the first control terminal; a third transistor including a third current terminal, a fourth current terminal, and a third control terminal, the third current terminal coupled to the first control terminal; a fourth transistor including a fifth current terminal, the fifth current terminal coupled to the second current terminal; and a fifth transistor including a sixth current terminal, the sixth current terminal coupled to the fourth current terminal.

19 Claims, 7 Drawing Sheets

METHODS AND APPARATUS TO REDUCE VARIATIONS FOR ON-OFF KEYING TRANSMISSIONS

TECHNICAL FIELD

This description relates generally to signal modulation, and more particularly to methods and apparatus to reduce variations for on-off keying transmissions.

BACKGROUND

Isolation barriers (e.g., galvanic isolators, capacitive isolators, inductive isolators, and optical isolators) are commonly used to isolate digital signals from noisy environments (such as a switching circuit, etc.) and isolate circuits operating at one voltage from circuits operating at a different voltage. Some example applications use a digital isolator to transfer a digital signal across an isolation barrier. A digital isolator is configured to modulate the digital signal onto a carrier signal which traverses the isolation barrier. In order to traverse the isolation barrier, a digital signal (e.g., digital data) is modulated with a carrier signal (using, for example, a method such as on-off keying (OOK) modulation). As such, digital isolators commonly include OOK modulation circuitry to modulate the digital signal onto the carrier signal before the carrier signal traverses the isolation barrier. The OOK modulation circuitry often creates variations (e.g., jitter, duty cycle distortion, intersymbol interference) in the carrier signal.

SUMMARY

For methods and apparatus to reduce variations for on-off keying transmissions, an example apparatus includes an on-off keying (OOK) modulator including: a first transistor including a first control terminal; a second transistor including a first current terminal, a second current terminal, and a second control terminal, the first current terminal coupled to the first control terminal; a third transistor including a third current terminal, a fourth current terminal, and a third control terminal, the third current terminal coupled to the first control terminal; a fourth transistor including a fifth current terminal, the fifth current terminal coupled to the second current terminal; and a fifth transistor including a sixth current terminal, the sixth current terminal coupled to the fourth current terminal

BRIEF DESCRIPTION OF THE DRAWINGS

The same reference numbers or other reference designators are used in the drawings to designate the same or similar (functionally and/or structurally) features.

DETAILED DESCRIPTION

Figure 1:
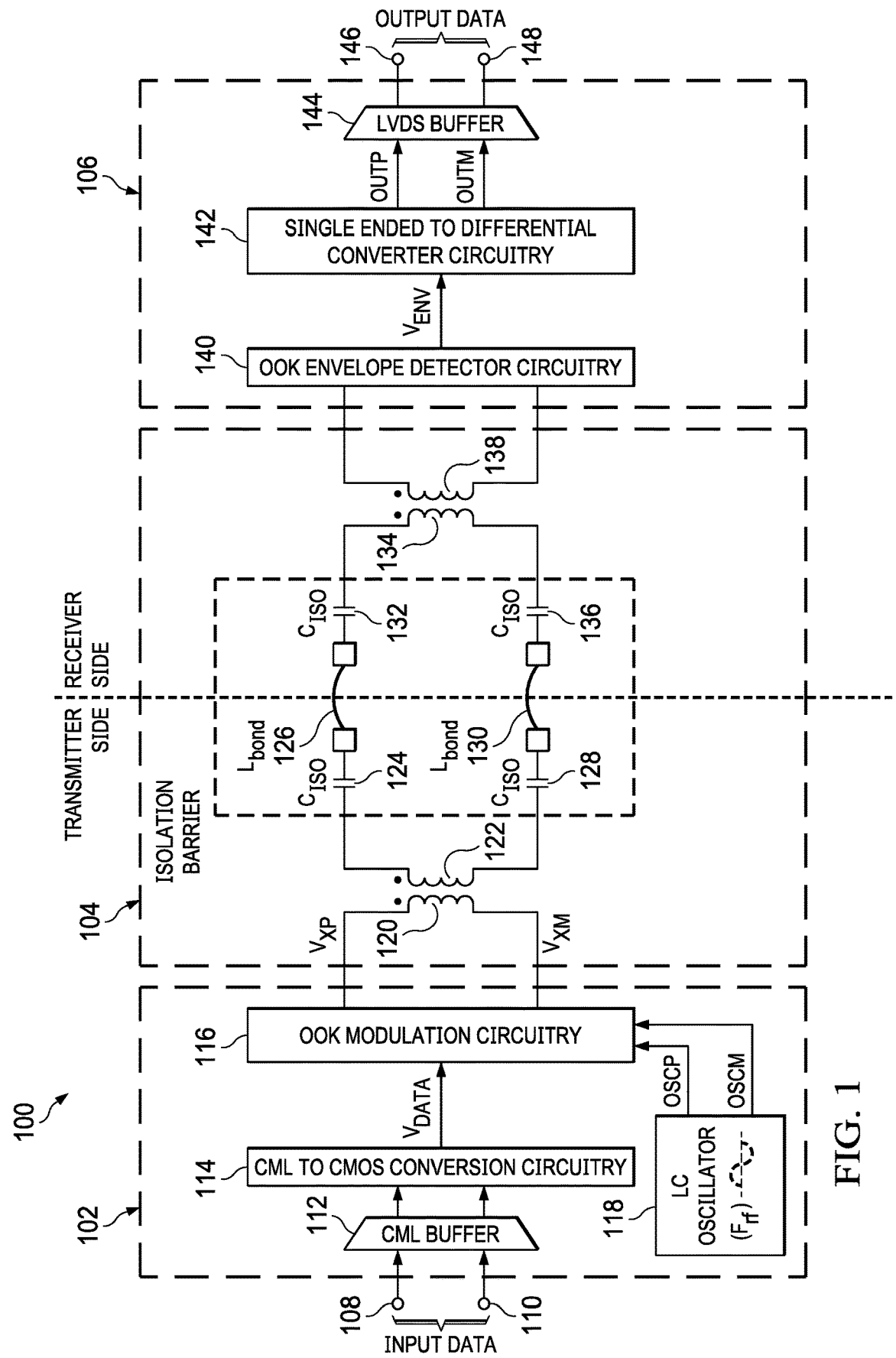
FIG. 1 is a block diagram of example digital isolator circuitry.

The drawings are not necessarily to scale.

OOK modulation circuitry is utilized by a number of applications, including digital isolator circuitry. Digital isolators (as used herein, "digital isolator" and "digital isolation circuitry" mean circuitry that includes an isolation barrier and/or circuitry to transmit and/or receive signals, such as data and/or instructions, across the isolation barrier) may be used to transmit information over isolation barriers by using a digital input signal to modulate a carrier signal (e.g., modulating a carrier frequency with data) before transmission. Before the carrier signal traverses the isolation barrier, the digital isolator uses an OOK modulation circuit to convert a digital input signal into a modulated carrier signal. The OOK modulation circuit is configured to use OOK modulation techniques to generate the modulated carrier signal based on the digital input signal.

A modulated carrier signal may exhibit variations (such as jitter, duty cycle distortion, intersymbol interference, etc.) as a result of OOK modulation circuitry. The variations may be caused by the speed of the data transmission on the digital input signal and variations within circuit components comprising the OOK modulation circuitry. For example, jitter on the modulated carrier signal may be the result of noise produced by the OOK modulation circuitry during the process of using a digital input to modulate a carrier signal. Intersymbol interference (ISI) is a form of distortion in a signal in which one symbol interferes with one or more subsequent symbols. The modulated carrier signal may exhibit ISI as a result of the components of the OOK modulation circuitry not being designed to operate at a frequency required by the speed of the data transmission of the digital input signal. For example, the carrier signal exhibits ISI as the result of the OOK modulation circuitry not enabling and/or disabling a transistor at a frequency required to accurately represent the data transmission used to modulate the carrier signal.

Typically, OOK modulation circuitry includes a digital input signal, an oscillator input signal, and a bias current input. In some applications, the OOK modulation circuitry is configured to generate an OOK carrier signal by using the digital input signal to control the modulation of the carrier signal by controlling a first switch to enable the oscillator input signal to enable a second switch to generate the OOK carrier signal. The OOK modulation circuitry is configured to enable or disable the first switch based on the digital input signal enabling or disabling a gate voltage of the first switch. Conventionally, the OOK modulation circuitry is configured to use a bias current input to generate the gate voltage used to enable the first switch. In such an arrangement, the OOK modulation circuitry may generate a carrier signal that exhibits ISI as a result of the speed of the data transmission of the digital input signal being greater than the speed at which the OOK modulation circuitry may enable or disable the first switch.

The OOK modulation circuitry of some examples is configured to use a digital input signal to control a switch which enables an oscillator input signal to generate a modulated carrier signal. The OOK modulation circuitry of some examples include example circuitry to limit the range of a voltage applied to a gate terminal used to generate a modulated carrier signal. In such an example, the limited range of the gate voltage allows the switch to be enabled and disabled at a faster rate. The OOK modulation circuitry of some examples is configured to use a plurality of voltage biases to limit the range of the gate voltage to voltage values near the threshold of a transistor. In some described examples, the OOK modulation circuitry includes level shifting circuitry to decrease the rise and fall time of a digital input signal. The OOK modulation circuitry implements both a reduced range of the gate voltage and level shifting circuitry to reduce variations in the OOK modulation of the digital input signal. Alternatively, the OOK modulation circuitry may implement either a reduced range of the gate voltages or the input level shifting circuitry to reduce variations in the modulated carrier signal.

FIG. 1 is a block diagram of example digital isolator circuitry 100. In the example of FIG. 1, the digital isolator circuitry 100 includes an example transmission circuit 102, an example isolation barrier circuit 104, and an example receiver circuit 106. The transmission circuit 102 is configured to generate a modulated carrier signal based on a digital input signal, such that the modulated carrier signal may traverse an isolation barrier. The isolation barrier circuit 104 is configured to include an isolation barrier, wherein the modulated carrier signal may be transmitted to the receiver circuit 106. The receiver circuit 106 is configured to generate a digital output signal based on the modulated carrier signal received from the isolation barrier circuit 104.

In the example of FIG. 1, the transmission circuit 102 includes an example first digital input terminal 108, a second digital input terminal 110, an example current mode logic (CML) buffer 112, example CML to complementary metal oxide semiconductor (CMOS) converter circuitry 114, example OOK modulation circuitry 116, and an example oscillator 118. The transmission circuit 102 is configured to generate a modulated carrier signal based on a digital input coupled to the digital input terminals 108 and 110. The digital input terminals 108 and 110 are configured to represent the digital input as a differential signal, such that the difference between the voltages of the digital input terminals 108 and 110 represent the digital input. For example, the digital input is a logic high as a result of the voltage difference between the digital input terminals being approximately 3.3 volts (V). Alternatively, the digital input of the transmission circuit 102 may be a single ended signal, such that the difference between the voltage of a digital input terminal (e.g., the digital input terminal 108 or 110) and common potential (e.g., ground) represent the digital input.

The digital input terminals 108 and 110 are coupled to the CML buffer 112. The CML buffer 112 is configured as a differential buffer. The digital input terminals 108 and 110 are buffered by the CML buffer 112, such that a differential output of the CML buffer 112 is isolated from the digital input terminals 108 and 110. Alternatively, the CML buffer 112 may be a plurality of single ended buffers configured to individually buffer each of the digital input terminals 108 and 110.

The CML buffer 112 is coupled to the CML-to-CMOS converter circuitry 114. The CML-to-CMOS converter circuitry 114 is configured to convert the digital input signals from CML to CMOS logic. CML is typically used for digital logic operations, such that digital circuitry may be configured to generate, alter, and/or process a digital signal. CMOS logic is typically used for signal transmission as a result of greater power efficiency at higher frequencies than a CML signal. Advantageously, the CML-to-CMOS converter circuitry 114 increases the efficiency of the digital isolator circuitry 100 by converting the digital input signal from CML to CMOS for more efficient transmission across the isolation barrier circuit 104.

The CML-to-CMOS converter circuitry 114 is coupled to the OOK modulation circuitry 116. The OOK modulation circuitry 116 is configured to generate a modulated carrier signal based on a digital signal input and an oscillator input. The OOK modulation circuitry 116 may be configured as a power amplifier, such that an output of the OOK modulation circuitry 116 may traverse the isolation barrier circuit 104. The OOK modulation circuitry 116 may generate the modulated carrier signal to be of a frequency of the oscillator 118 as the result of a logic "1," or a logic high, of the digital input signal. For example, the logic high signal is a signal (e.g., a voltage, a current, etc.) representative of a digital one (e.g., a digital '1' or a logic '1'), such as a voltage of 2.2V, 3.3V, 5V, etc. In some examples, a logic low signal is a signal representative of a digital zero (e.g., a digital '0' or a logic '0'), such as a ground voltage.

The CML buffer 112 and the CML-to-CMOS converter circuitry 114 are configured to buffer and convert the input received at the digital input terminals 108 and 110. Such operations result in a logic "0" and logic "1" being represented by the same value at the output of the CML-to-CMOS converter circuitry 114 as at the digital input terminals 108 and 110. In this example, CML-to-CMOS converter circuitry 114 outputs a logic high signal which may be used to control a transistor to modulate the carrier signal. The OOK modulation circuitry 116 may generate the modulated carrier signal to be equal to common potential (e.g., ground) as the result of a logic "0" or a logic low of the digital input signal. For example, the modulated carrier signal generated by the OOK modulation circuitry 116 would have a frequency of the oscillator 118 as the result of the digital input terminals 108 and 110 configured to represent a logic high (e.g., there is a potential difference between terminals). Advantageously, the OOK modulation circuitry 116 is configured to generate a modulated carrier signal of enough power to traverse the isolation barrier circuit 104.

The OOK modulation circuitry 116 is coupled to the oscillator 118. The oscillator 118 is configured to output a differential (e.g., two complementary signals) sinusoidal wave (OSCP and OSCM) of a frequency, which may be referred to as a carrier frequency. The oscillator 118 may be configured to generate a signal with a frequency based on a speed of the data transmission and intended frequency of the modulated carrier signal. For example, the oscillator 118 may be configured to generate a sinusoidal signal with of frequency of approximately 14.5 gigahertz (GHz). This signal can be used by the OOK modulation circuitry 116 as the carrier frequency signal with is modulated by a digital signal (which may have a data rate of approximately 480 megabits per second (Mbps)). Advantageously, the frequency of the modulated carrier signal generated by the OOK modulation circuitry 116 may be modified based on the frequency of the oscillator 118.

In the example of FIG. 1, the transmission circuit 102 is coupled to the isolation barrier circuit 104. The isolation barrier circuit 104 includes an example first inductor 120, a second inductor 122, an example first capacitor ($C_{ISO}$) 124, an example first bond wire ($L_{bond}$) 126, a second capacitor ($C_{ISO}$) 128, a second bond wire ($L_{bond}$) 130, a third capacitor ($C_{ISO}$) 132, a third inductor 134, a fourth capacitor ($C_{ISO}$) 136, and a fourth inductor 138. The isolation barrier circuit 104 is configured to isolate the transmission circuit 102 from the receiver circuit 106. Inductors 120 and 122 may be magnetically coupled (e.g., they may form a transformer).

The OOK modulation circuitry 116 of the transmission circuit 102 is coupled to the first inductor 120. The first inductor 120 is magnetically coupled to the second inductor 122. The first inductor 120 is configured to induce a current in the second inductor 122 based on the modulated carrier signal generated by the OOK modulation circuitry 116. The first inductor 120 may be configured based on the second inductor 122, such that the difference between inductors may induce currents of different magnitudes. The first inductor 120 may be configured to induce the current in the second inductor 122 based on the properties (e.g., the number of windings, the direction of the windings, etc.) of the inductors 120 and 122.

The second inductor 122 is coupled between the capacitors 124 and 128. The second inductor 122 is configured to induce a current based on the modulated carrier signal of the first inductor 120. The current induced in the second inductor 122 is configured to traverse an isolation barrier (e.g., the isolation barrier formed by capacitors 124, 128, 132 and 136). The second inductor 122 may be configured to induce a current based on the properties (e.g., the number of windings, the direction of the windings, etc.) of the inductors 120 and 122.

The first capacitor 124 is coupled between the second inductor 122 and the first bond wire 126. The first capacitor 124 is configured to isolate the second inductor 122 from the first bond wire 126. The first capacitor 124 is configured to remove any direct current that may be induced in the first bond wire 126 or induced within the second inductor 122. Alternatively, the first bond wire 126 may be another type of conductor, such as a metal wiring in a semiconductor device or a metal trace on a printed circuit board (PCB).

The second capacitor 128 is coupled between the second inductor 122 and the second bond wire 130. The second capacitor 128 is configured to isolate the second inductor 122 from the second bond wire 130. The second capacitor 128 is configured to remove any direct current that may be induced in the second bond wire 130 or induced within the second inductor 122. Alternatively, the second bond wire 130 may be another type of conductor, such as a metal wiring in a semiconductor device or a metal trace on a PCB.

The third capacitor 132 is coupled between the first bond wire 126 and the third inductor 134. The third capacitor 132 is configured to isolate the third inductor 134 from the first bond wire 126. The third capacitor 132 is configured to remove any direct current that may be induced in the first bond wire 126 or induced within the third inductor 134.

The third inductor 134 is coupled between the capacitors 132 and 136. The third inductor 134 is configured to induce a current in the fourth inductor 138 based on the modulated carrier signal induced in the second inductor 122 (e.g., the third inductor 134 is magnetically coupled to fourth inductor 138). The third inductor 134 may be configured to induce the current in the fourth inductor 138 based on the properties (e.g., the number of windings, the direction of the windings, etc.) of the inductors 134 and 138. The inductors 134 and 138 may be magnetically coupled (e.g., they may form a transformer).

The fourth capacitor 136 is coupled between the second bond wire 130 and the third inductor 134. The fourth capacitor 136 is configured to isolate the second bond wire 130 from the third inductor 134. The fourth capacitor 136 is configured to remove any direct current that may be induced in the second bond wire 130 or induced within the third inductor 134.

In the example of FIG. 1, the isolation barrier circuit 104 is coupled to the receiver circuit 106. The receiver circuit 106 includes example OOK envelope detector circuitry 140, example single ended to differential converter circuitry 142, an example low voltage differential signal (LVDS) buffer 144, an example first digital output terminal 146, and a second digital output terminal 148. The receiver circuit 106 is configured to generate a digital output signal based on the modulated carrier signal from the isolation barrier circuit 104.

The fourth inductor 138 of the isolation barrier circuit 104 is coupled to the OOK envelope detector circuitry 140. The OOK envelope detector circuitry 140 is configured to generate a digital output signal based on the modulated carrier signal induced in the fourth inductor 138 of the isolation barrier circuit 104. The OOK envelope detector circuitry 140 may be configured to generate a logic "1" or a logic high (based on the modulated carrier signal transmitted across the isolation barrier 104) of a duration based on determining a frequency of the duration. The OOK envelope detector circuitry 140 may be configured to generate a logic "0" or a logic low (based on the modulated carrier signal transmitted across the isolation barrier 104) of a duration based on determining a frequency of the duration. For example, the OOK envelope detector circuitry 140 would generate a logic high (or a logic "1") for 10 picoseconds (pS) based on determining a frequency of the modulated carrier for the same 10 pS duration.

The OOK envelope detector circuitry 140 is coupled to the single ended to differential converter circuitry 142. The single ended to differential converter circuitry 142 is configured to convert the digital output signal generated by OOK envelope detector circuitry 140 into a differential digital output signal, such that the difference between the digital output terminals 146 and 148 represents a digital signal. For example, the single ended to differential converter circuitry 142 may generate a logic high (or a logic "1") by creating a potential difference between two outputs (OUTP and OUTM) of a magnitude based on a difference between the digital output signal generated by the OOK envelope detector circuitry 140 and common potential (e.g., ground).

The single ended to differential converter circuitry 142 is coupled to the LVDS buffer 144. The LVDS buffer 144 is configured as a differential buffer. The LVDS buffer 144 is configured to isolate a differential output of the single ended to differential converter circuitry 142 from the digital output terminals 146 and 148. Alternatively, the LVDS buffer 144 may be a plurality of single ended buffers configured to individually buffer each of the digital output terminals 146 and 148. Advantageously, the digital output signal generated by the LVDS buffer 144 is a digital representation of the modulated carrier signal.

In some examples, the digital isolator circuitry 100 is a single integrated circuit (IC) (such as circuitry implemented on a single semiconductor die or on multiple die but within a single IC package). For example, the transmission circuit 102 and the receiver circuit 106 may be included on the same semiconductor die. In some examples, the digital isolator circuitry 100 may be implemented by two or more ICs in a single IC package or may be implement as a multi-chip module (MCM). In some examples, the digital isolator circuitry 100 may be implemented by two or more ICs (such as two or more IC packages). For example, the transmission circuit 102 may be on a first die and the receiver circuit 106 may be on a second die. In some examples, the transmission circuit 102 may be on a first die, the isolation barrier circuit 104 may be on a second die, and the receiver circuit 106 may be on a third die. Alternatively, one or more hardware circuit components (such as the CML buffer 112, the CML-to-CMOS converter circuitry 114, the OOK modulation circuitry 116, etc.) of the transmission circuit 102 may be included in the isolation barrier circuit 104. Alternatively, one or more hardware circuit components (such as the inductors 120 and 122, the capacitors 124 and 128, etc.) of the isolation barrier circuit 104 may be included in the transmission circuit 102. Alternatively, one or more hardware circuit components (such as inductors 134 and 138, the capacitors 132 and 136, etc.) of the isolation barrier circuit 104 may be included in the receiver circuit 106.

In example operation, the digital isolator circuitry 100 is configured to receive a differential digital input signal at the digital input terminals 108 and 110. Alternatively, the digital isolator circuitry 100 may be configured to receive a single ended digital input signal at the digital input terminals 108 and/or 110. The CML buffer 112 is configured to buffer the digital input signal, such that circuitry coupled to the digital input terminals 108 and 110 are less likely to alter the operation of the digital isolation circuitry 100. The CML buffer 112 outputs a differential digital input signal to the CML-to-CMOS converter circuitry 114, such that the CML-to-CMOS converter circuitry 114 may convert the differential digital input signal to a CMOS digital input signal. Advantageously, the conversion from a CML signal to a CMOS signal increases the power efficiency of the modulated carrier signal as it traverses the isolation barrier circuit 104.

The CMOS digital input signal is coupled to the OOK modulation circuitry 116. The OOK modulation circuitry 116 is configured to implement OOK modulation to generate a modulated carrier signal based on the CMOS digital input signal and the oscillator 118. For example, the OOK modulation circuitry 116 generates a digital logic high on the modulated carrier signal by enabling the oscillator 118 to contribute a signal of a magnitude greater than zero for the duration of the digital logic high. Advantageously, the OOK modulation circuitry 116 generates a modulated carrier signal capable of traversing the isolation barrier circuit 104.

The modulated carrier signal is induced by the first inductor 120 in the second inductor 122. The modulated carrier signal is configured to traverse the wire bonds 126 and 130. The modulated carrier signal is induced by the third inductor 134 in the fourth inductor 138, such that the receiver circuit 106 may receive the modulated carrier signal as an input.

The receiver circuit 106 is configured to receive the modulated carrier signal from the fourth inductor 138 of the isolation barrier circuit 104. The OOK envelope detector circuitry 140 is configured to generate a digital output signal based on the modulated carrier signal. For example, the OOK envelope detector circuitry 140 may generate a logic low based on determining that the magnitude of the modulated carrier signal is near common potential (e.g., ground). Advantageously, the OOK envelope detector circuitry 140 is configured to generate the digital output signal based on the modulated carrier signal, such that the digital output signal is similar (ideally exactly the same) to the CMOS digital signal generated by the CML-to-CMOS converter circuitry 114.

The single ended to differential converter circuitry 142 is configured to generate a differential digital output signal based on the digital output signal generated by the OOK envelope detector circuitry 140. The LVDS buffer 144 is configured to buffer the differential digital output signal from the digital output terminals 146 and 148. Advantageously, the LVDS buffer 144 is configured to prevent circuitry coupled to the digital output terminals 146 and 148 from altering the functionality of the digital isolator circuitry 100. In some examples, transmitter 102 may be implemented as a transceiver (e.g., a transmitter and/or receiver) and receiver 106 may be implemented as a transceiver so that signals may pass through isolation barrier 104 in either direction. In such examples, transmitter 102 may include additional circuitry to receive signals and/or receiver 106 may include additional circuitry to transmit signals.

Figure 2:
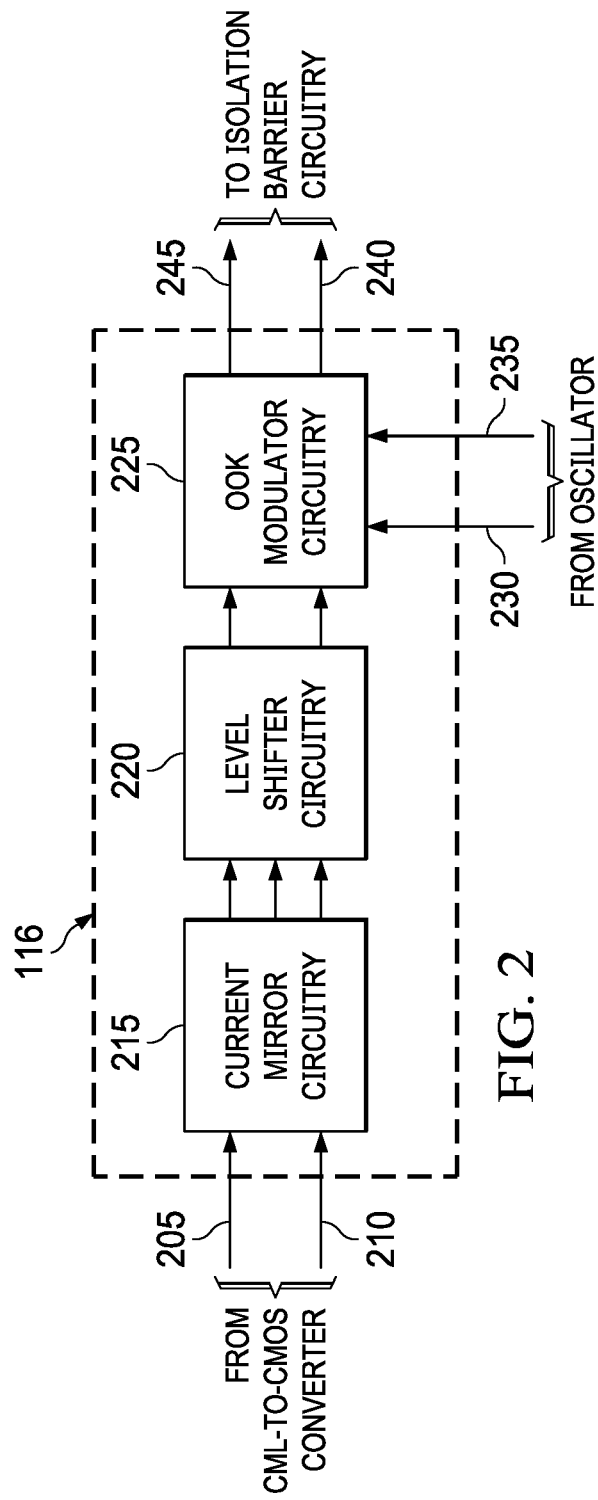
FIG. 2 is a block diagram of an example implementation of the OOK modulation circuitry including example current mirror circuitry, example level shifter circuitry, and example OOK modulator circuitry.

FIG. 2 is a block diagram of an example implementation of the OOK modulation circuitry 116 of FIG. 1. In the example of FIG. 2, the OOK modulation circuitry 116 includes a system comprised of an example first digital input terminal 205, a second digital input terminal 210, example current mirror circuitry 215, example level shifter circuitry 220, example OOK modulator circuitry 225, an example first oscillator input terminal 230, a second oscillator input terminal 235, an example first modulated carrier output terminal 240, and a second modulated carrier output terminal 245. The OOK modulation circuitry 116 is configured to generate an OOK modulated carrier signal based on a digital input signal from the CML-to-CMOS converter circuitry 114 of FIG. 1 and the oscillated signal (e.g., sinusoidal carrier signal) from the oscillator.

The digital input terminals 205 and 210 are configured to represent a differential digital input signal, such that the digital input terminals 205 and 210 are complementary signals. For example, the digital input signal may be a logic low based on the first digital input terminal 205 being determined to be approximately (preferably exactly) equal to common potential (e.g., ground) and the second digital input terminal 210 being determined to be a logic high. Alternatively, the OOK modulation circuitry 116 may be modified to receive a single ended digital input signal by coupling one of the digital input terminals 205 or 210 to the single ended digital input signal and the other digital input terminal 205 or 210 to an inverted replica of the single ended digital input signal.

The digital input terminals 205 and 210 are configured as the inputs of the current mirror circuitry 215. The current mirror circuitry 215 is configured to generate a current representing the digital input signal. For example, the current mirror circuitry 215 would generate a current representing a logic low during the same duration as the digital input signal representing a logic low. Alternatively, the OOK modulation circuitry 116 may be modified to include a buffer to replace the current mirror circuitry 215. Advantageously, the current mirror circuitry 215 isolates circuitry coupled to the digital input terminals 205 and 210, such that the impacts of the circuitry on the OOK modulation circuitry 116 are reduced.

The Current mirror circuitry 215 is coupled to the level shifter circuitry 220. The level shifter circuitry 220 is configured to generate a shifted differential digital signal with a maximum voltage (representing a logic "1", a logic high, or a differentially positive value) and a minimum voltage (representing a logic "0", a logic low, or a differentially negative value) based on the current representation of the digital input signal generated by the current mirror circuitry 215. For example, the level shifter circuitry 220 may be configured to provide approximately 3 volts as the maximum value, representing a logic high, and approximately 0.7 volts as the minimum value, representing a logic low. The level shifter circuitry 220 may be configured to generate the shifted differential digital signal based on the components of the OOK modulator circuitry 225. Advantageously, the shifted differential digital signal generated by the level shifter circuitry 220 may transition between a logic high and a logic low at a speed greater than a transition of the digital input signal based on the reduced difference between the maximum voltage and the minimum voltage of the shifted differential digital signal.

The level shifter circuitry 220 is coupled to the OOK modulator circuitry 225. The OOK modulator circuitry 225 is configured to generate a modulated carrier signal based on the shifted differential digital signal generated by the level shifter circuitry 220, and sinusoidal signal received at the oscillator input terminals 230 and 235 from the oscillator 118 of FIG. 1. For example, the OOK modulator circuitry 225 may output the signal received at the oscillator input terminals 230 or 235 to represent a logic high, or OOK modulator 225 may alter the magnitude of the received oscillator signal based on the level-shifted signal (e.g., the level-shifted logic "1" value) received from level shifter 220. The OOK modulator circuitry 225 is configured to generate the modulated carrier signal on the modulated carrier output terminals 240 and 245. Advantageously, the shifted differential digital signal enables the OOK modulator circuitry 225 to generate a modulated carrier signal with reduced jitter and ISI.

In example operation, a differential digital input signal is coupled to the digital input terminals 205 and 210. The current mirror circuitry 215 is configured to generate a current representing the differential input signal. Advantageously, the current mirror circuitry 215 isolates the differential digital input signal from the OOK modulator circuitry 116. The level shifter circuitry 220 generates a shifted differential digital signal based on the current representing the differential input signal, such that the difference, in voltage, between a logic high and a logic low is reduced. The shifted differential digital signal generated by the level shifter circuitry 220 is configured to transition between a logic high and a logic low at a speed greater than the transition of the differential digital input signal. The OOK modulator circuitry 225 generates the modulated carrier signal on the modulated carrier output terminals 240 and 245 based on the shifted differential digital signal and the oscillator input terminals 230 and 235. Advantageously, the modulated carrier signal generated by OOK modulation circuitry 116 exhibits reduced jitter and ISI compared to if the OOK modulator circuitry 225 generated the modulated carrier signal based on the differential input, such that the current mirror circuitry 215 and level shifter circuitry 220 are disabled. Alternatively, the OOK modulation circuitry 116 may include the OOK modulator circuitry 225 without the current mirror circuitry 215 and/or the level shifter circuitry 220.

Figure 3:
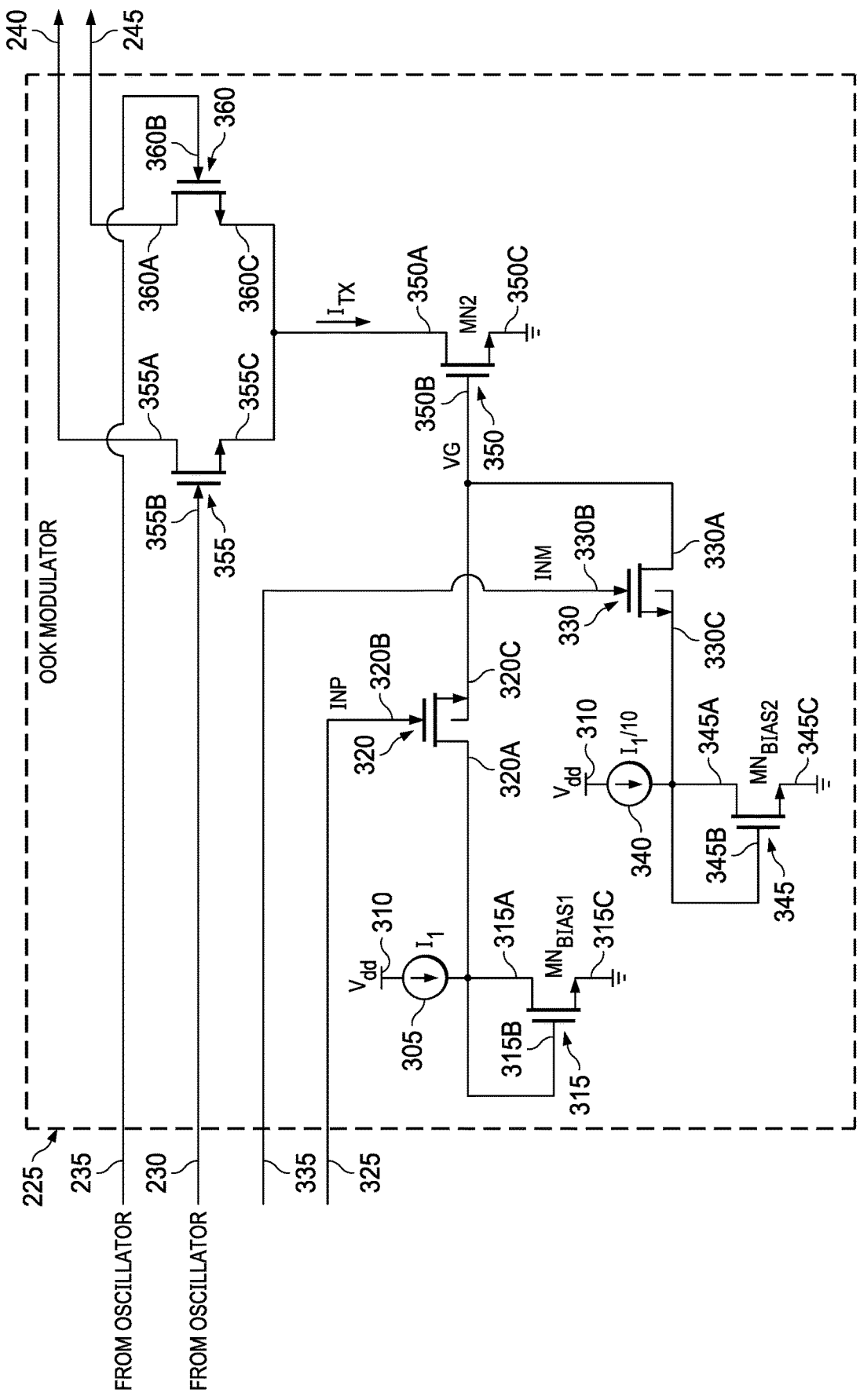
FIG. 3 is a schematic diagram of the OOK modulator circuitry of FIG. 2.

FIG. 3 is a schematic diagram of the OOK modulator circuitry 225 of FIG. 2. Alternatively, the OOK modulator circuitry 225 may be used to implement the OOK modulation circuitry 116 of FIG. 1. In the example of FIG. 3, the OOK modulator circuitry 225 includes the first oscillator input terminal 230, the second oscillator input terminal 235, the first modulated carrier output terminal 240, the second modulated carrier output terminal 245, an example first current source (I1) 305, an example voltage supply ($V_{dd}$) 310, an example first transistor ($MN_{BIAS1}$) 315, a second transistor 320, an example first digital input terminal (signal INP) 325, a third transistor 330, a second digital input terminal (signal INM) 335, a second current source (I1/10) 340, a fourth transistor ($MN_{BIAS2}$) 345, a fifth transistor (MN2) 350, a sixth transistor 355, and a seventh transistor 360. The OOK modulator circuitry 225 is configured to generate a modulated carrier signal on the modulated carrier output terminals 240 and 245 by using the digital input terminals 325 and 335) to control the oscillator input terminals 230 and 235. Alternatively, the digital input terminals 325 and 335 may be coupled to the digital input terminals 205 and 210 of FIG. 2.

The first current source 305 is coupled between the voltage supply 310 and a first current terminal 315A of the first transistor 315. A drain terminal and/or a source terminal may be referred to as a current terminal. A gate terminal may be referred to as a control terminal. The first current source 305 is configured to supply a current of a first magnitude ($I_1$) from the voltage supply 310 to the first transistor 315. The first magnitude of the first current source 305 is determined based on a first bias voltage ($V_{BIAS1}$). The first bias voltage is generated based on the inverse of the transconductance (in siemens) of the first transistor 315 times the first magnitude of the first current source 305. For example, $V_{BIAS1}$ is equal to one volt as the result of the first magnitude of the first current source 305 being equal to 20 milli amps and the transconductance of the first transistor 315 being equal to 20 milli siemens.

The first current terminal 315A of the first transistor 315 is coupled to the first current source 305. The control terminal 315B of the first transistor 315 is coupled to a first current terminal 320A of the second transistor 320. A second current terminal 315C of the first transistor 315 is coupled to common potential (e.g., ground). The first transistor 315 is configured to allow current to flow from first current source 305 to common potential. The first transistor 315 generates the first bias voltage on the first current terminal 315A of the first transistor 315 based on the first magnitude of the first current source 310 times the inverse of the transconductance (in siemens) of the first transistor 315. Alternatively, the first transistor 315 and first current source 305 may be replaced with a voltage reference or circuitry configured to generate a reference voltage. The first transistor 315 is a N-channel metal oxide semiconductor transistor (MOSFET). Alternatively, the first transistor 315 may be implemented using a diode (e.g., with a reference voltage), an N-channel field-effect transistor (FET), an N-channel insulated-gate bipolar transistor (IGBT), an N-channel junction field effect transistor (JFET), an NPN bipolar junction transistor (BJT) and/or, with slight modifications, a p-type equivalent device.

The first current terminal 320A of the second transistor 320 is coupled to the first current source 305 and the first transistor 315, such that the first current terminal 320A of the second transistor 320 is approximately (preferably exactly) equal to first bias voltage generated by the first transistor 315. A control terminal 320B of the second transistor 320 is coupled to the first digital input terminal 325. A second current terminal 320C of the second transistor 320 is coupled to a first current terminal 330A of the third transistor 330. The second transistor 320 is configured to be enabled as a result of a logic high or a logic "1" on the first digital input terminal 325. Additionally, the second transistor 320 is configured to be disabled as a result of a logic low or a logic "0" on the first digital input terminal 325. For example, the second current terminal 320C of the second transistor 320 is set to approximately the first bias voltage as the result of a logic high on the first digital input terminal 325. The second transistor 320 is a N-channel MOSFET. Alternatively, the second transistor 320 may be an N-channel FET, an N-channel IGBT, an N-channel JFET, an NPN BJT and/or, with slight modifications, a p-type equivalent device.

The first current terminal 330A of the third transistor 330 is coupled to the second current terminal 320C of the second transistor 320 and a control terminal 350B of the fifth transistor 350. A control terminal 330B of the third transistor 330 is coupled to the second digital input terminal 335. A second current terminal 330C of the third transistor 330 is coupled to the second current source 340, a first current terminal 345A of the fourth transistor 345, and a control terminal 345B of the fourth transistor 345. The third transistor 330 is configured to be enabled as a result of a logic high or a logic "1" on the second digital input terminal 335. Additionally, the third transistor 330 is configured to be disabled as a result of a logic low or a logic "0" on the second digital input terminal 335. For example, the current terminals 330A and 330C of the third transistor 330 are approximately the same voltage as the result of a logic high on the first digital input terminal 325. The third transistor 330 is a N-channel MOSFET. Alternatively, the third transistor 330 may be an N-channel FET, an N-channel IGBT, an N-channel JFET, an NPN BJT and/or, with slight modifications, a p-type equivalent device.

The second current source 340 is coupled between the voltage supply 310 and the first current terminal 345A of the fourth transistor 345. The second current source 340 is configured to supply a current of a second magnitude ($I_1/10$) from the voltage supply 310 to the fourth transistor 345. The second magnitude of the second current source 340 is determined based on a second bias voltage ($V_{BIAS2}$). The second bias voltage is generated based on the inverse of the transconductance (in siemens) of the fourth transistor 345 times the second magnitude of the second current source 340. For example, $V_{BIAS2}$ is equal to 400 milli volts (mV) as the result of the second magnitude of the second current source 340 being equal to 8 milli amps and the transconductance of the fourth transistor 345 being equal to 20 milli siemens.

The first current terminal 345A of the fourth transistor 345 is coupled to the second current terminal 330C of the third transistor 330, second current source 340, and a control terminal 345B of the fourth transistor 345. A second current terminal 345C of the fourth transistor 345 is coupled to common potential (e.g., ground). The fourth transistor 345 is configured to allow current to flow from second current source 340 to common potential. The fourth transistor 345 generates the second bias voltage on the first current terminal 345A of the fourth transistor 345 based on the second magnitude of the second current source 340, times the inverse of the transconductance (in siemens) of the fourth transistor 345. Alternatively, the fourth transistor 345 and second current source 340 may be replaced with a voltage reference or circuitry configured to generate a reference voltage. The fourth transistor 345 is a N-channel MOSFET. Alternatively, the fourth transistor 345 may be an N-channel FET, an N-channel IGBT, an N-channel JFET, an NPN BJT and/or, with slight modifications, a p-type equivalent device.

The control terminal 350B of the fifth transistor 350 is coupled to the second current terminal 320C of the second transistor 320 and the first current terminal 330A of the third transistor 330. A first current terminal 350A of the fifth transistor 350 is coupled to a second current terminal 355C of the sixth transistor 355 and a second current terminal 360C of the seventh transistor 360. The fifth transistor 350 is configured to be enabled as a result of the second transistor 320 being enabled, such that the first bias voltage, generated by the first transistor 315, is coupled to the control terminal 350B of the fifth transistor 350. The fifth transistor 350 is configured to be disabled as the result of the second transistor 320 being disabled and the third transistor 330 being enabled, such that the second bias voltage, generated by the fourth transistor 345, is coupled to the control terminal 350B of the fifth transistor 350. For example, the fifth transistor 350 is enabled as the result of a logic high on the first digital input terminal 325, a logic low on the second digital input terminal 335, and the first bias voltage being greater than a threshold voltage of the fifth transistor 350. The first bias voltage and the second bias voltage are configured to be a control voltage applied to the control terminal 350B, such that the voltage applied to the control terminal 350B is within the range of the bias voltages. The fifth transistor 350 is a N-channel MOSFET. Alternatively, the fifth transistor 350 may be an N-channel FET, an N-channel IGBT, an N-channel JFET, an NPN BJT and/or, with slight modifications, a p-type equivalent device.

The first modulated carrier output terminal 240 is coupled to a first current terminal 355A of the sixth transistor 355. The first oscillator input terminal 230 is coupled to a control terminal 355B of the sixth transistor 355. The second current terminal 355C of the sixth transistor 355 is coupled to the first current terminal 350A of the fifth transistor 350. The sixth transistor 355 is configured to be enabled and/or partially enabled based on the magnitude of the first oscillator input terminal 230 being greater than or equal to a voltage threshold of the sixth transistor 355. For example, a current passing through the sixth transistor 355 is a half-rectified sinewave of a frequency as the result of the oscillator 118 of FIG. 1 generating a sinewave of the frequency. Additionally, the sixth transistor 355 is configured to allow current to flow through the transistor based on whether or not the fifth transistor 350 is enabled. The sixth transistor 355 is a N-channel MOSFET. Alternatively, the sixth transistor 355 may be an N-channel FET, an N-channel IGBT, an N-channel JFET, an NPN BJT and/or, with slight modifications, a p-type equivalent device. Advantageously, the sixth transistor 355 generates positive magnitudes of the modulated carrier signal on the first modulated carrier output terminal 240.

The second modulated carrier output terminal 245 is coupled to a first current terminal 360A of the seventh transistor 360. The second oscillator input terminal 235 is coupled to a control terminal 360B of the seventh transistor 360. The second current terminal 360C of the seventh transistor 360 is coupled to the first current terminal 350A of the fifth transistor 350. The seventh transistor 360 is configured to be enabled and/or partially enabled based on the magnitude of the second oscillator input terminal 235 being greater than or equal to a voltage threshold of the seventh transistor 360. The second oscillator input terminal 235 is configured to be coupled to a complementary signal of the first oscillator input terminal 230, such that the second oscillator input terminal 235 is 180 degrees out of phase from the signal coupled to the first oscillator input terminal 230. For example, a current passing through the seventh transistor 360 is a half-rectified sinewave of a frequency as the result of the oscillator 118 generating a sinewave of the frequency. Additionally, the seventh transistor 360 is configured to allow current to flow through the transistor based on whether or not the fifth transistor 350 is enabled. The seventh transistor 360 is a N-channel MOSFET. Alternatively, the seventh transistor 360 may be an N-channel FET, an N-channel IGBT, an N-channel JFET, an NPN BJT and/or, with slight modifications, a p-type equivalent device. Advantageously, the seventh transistor 360 generates negative magnitudes of the modulated carrier signal on the second modulated carrier output terminal 245.

In example operation, the first bias voltage, generated by the first current source 305 and the first transistor 315, is configured to be of a magnitude greater than or equal to the threshold voltage of the fifth transistor 350. The second bias voltage, generated by the second current source 340 and the fourth transistor 345, is configured to be of a magnitude less than the threshold voltage of the fifth transistor 350.

The second transistor 320 is configured to be enabled by the first digital input terminal 325, such that the first bias voltage is coupled to the control terminal 350B of the fifth transistor 350 as the result of enabling the second transistor 320. The fifth transistor 350 is enabled as a result of the first bias voltage being coupled to the control terminal 350B of the fifth transistor 350 by the second transistor 320. The third transistor 330 is configured to be enabled by the second digital input terminal 335, such that the second bias voltage is coupled to the control terminal 350B of the fifth transistor 350 as the result of enabling the third transistor 330. The fifth transistor 350 is disabled as a result of the second bias voltage being coupled to the control terminal 350B of the fifth transistor 350 by the third transistor 330. The digital input signal coupled to the digital input terminals 325 and 335 is a differential signal, such that the digital input terminals 325 and 335 are the inverse of each other. For example, the first digital input terminal 325 is determined to be a logic low based on the second digital input terminal 335 being a logic high. Advantageously, the voltage applied to the control terminal 350B of the fifth transistor 350 is configured to be between approximately the first bias voltage and the second bias voltage. Advantageously, the duration to enable the fifth transistor 350 is reduced compared to disabling the fifth transistor 350 by coupling the control terminal 350B of the fifth transistor 350 to common potential (e.g., ground).

The oscillator input terminals 230 and 235 are coupled to an output of the oscillator 118, such that the oscillator input terminals 230 and 235 are coupled to complementary signals of a carrier frequency. The first oscillator input terminal 230 enables the sixth transistor 355, at a frequency approximately (preferably exactly) equal to that of the carrier frequency, for the magnitudes of the output of the oscillator 118 greater than zero. The sixth transistor 355 generates a positive portion of the modulated carrier signal on the first modulated carrier output terminal 240 based on the portions of the output of the oscillator 118 that are of a positive magnitude. The second oscillator input terminal 235 enables the seventh transistor 360, at a frequency approximately (preferably exactly) equal to that of the carrier frequency, for the magnitudes of the output of the oscillator 118 less than zero. The seventh transistor 360 generates a negative portion of the modulated carrier signal on the second modulated carrier output terminal 245 based on the portions of the output of the oscillator 118 that are of a negative magnitude. Additionally, the transistors 355 and 360 are configured to generate the modulated carrier signal based on the fifth transistor 350, such that enabling the fifth transistor 350 represents a logic high and disabling the fifth transistor 350 represents a logic low of the digital input signal. Advantageously, the transistors 355 and 360 generate a modulated carrier signal of a carrier frequency equal to that of the frequency of the oscillator 118.

Figure 4:
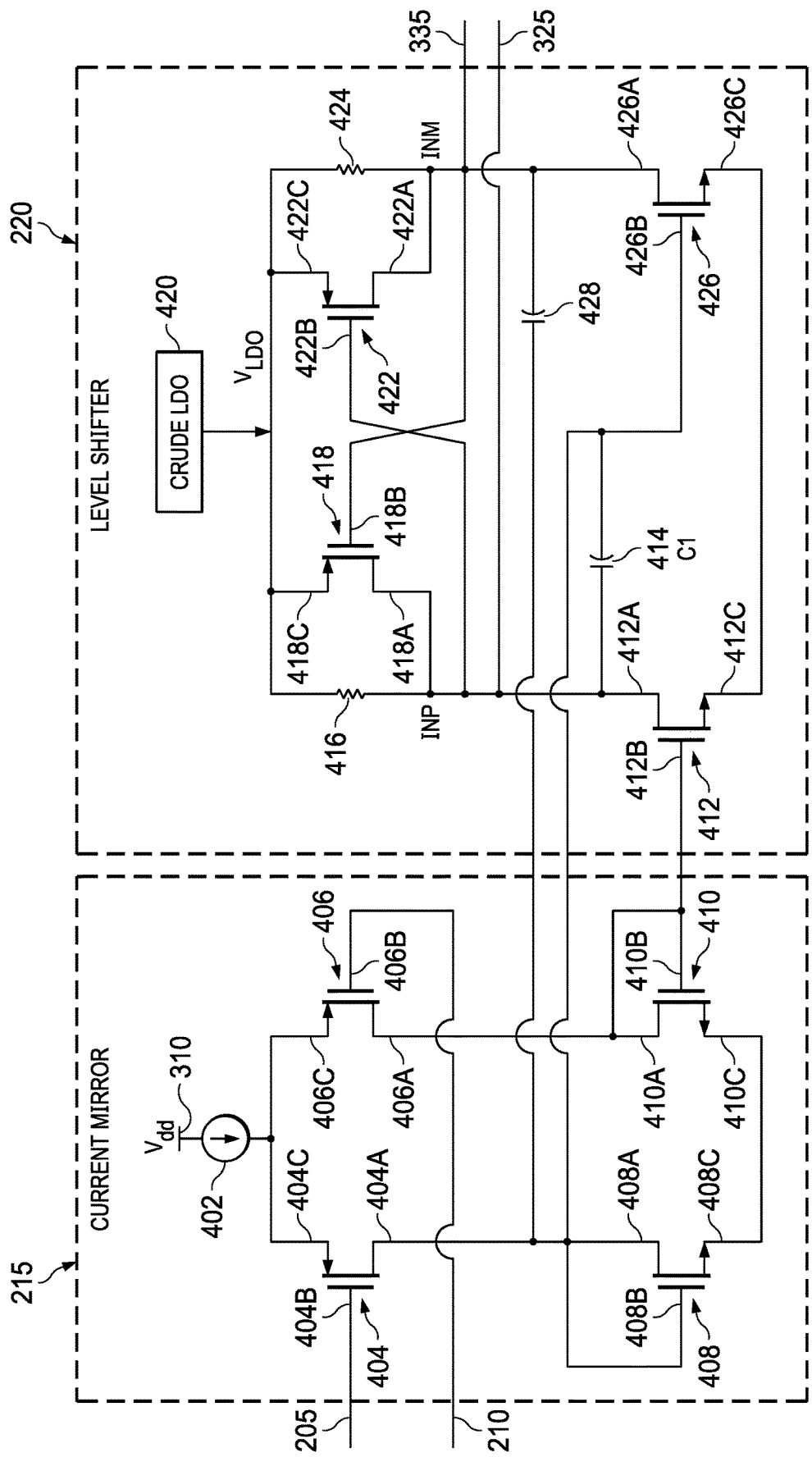
FIG. 4 is a schematic diagram of the level shifter circuitry of FIG. 2 and the current mirror circuitry of FIG. 2.

FIG. 4 is a schematic diagram of the current mirror circuitry 215 of FIG. 2 and the level shifter circuitry 220 of FIG. 2. In the example of FIG. 4, the current mirror circuitry 215 is configured to generate a copy of a digital input signal coupled to the digital input terminals 205 and 210. In the example of FIG. 4, the level shifter circuitry 220 is configured to generate a digital output signal on the digital input terminals 325 and 335 based on the copy of the digital input signal generated by the current mirror circuitry 215. Alternatively, the level shifter circuitry 220 may be coupled to the digital input terminals 205 and 210.

In the example of FIG. 4, the current mirror circuitry 215 includes an example current source 402, an example first transistor 404, a second transistor 406, a third transistor 408, and a fourth transistor 410. The current mirror circuitry 215 is configured to generate a copy of the digital input signal coupled to the digital input terminals 205 and 210, such that the value of first digital input terminal 205 is generated as the gate to drain voltage of the third transistor 408 and the value of the second digital input terminal 210 is generated as a gate to drain voltage of the fourth transistor 410. Advantageously, the current mirror circuitry 215 isolates the circuitry coupled to the digital input terminals 205 and 210 from the level shifter circuitry 220. Advantageously, the current flowing through the transistors 404 and 406, which is based on the digital input terminals 205 and 210, may be replicated in additional circuitry by coupling the gate of an additional transistor to the drain of the transistor 408 or 410.

The current source 402 is coupled between the voltage supply 310, a second current terminal 404C of the first transistor 404, and a second current terminal 406C of the second transistor 406. The current source 402 is configured to supply a current from the voltage supply 310 to the transistors 404 and 406, such that the transistors 404 and 406 may be enabled. Alternatively, the current source 402 may be replaced with a voltage source, or additional circuitry to supply power to the current mirror circuitry 215.

A first current terminal 404A of the first transistor 404 is coupled to a first current terminal 408A of the third transistor 408. A control terminal 404B of the first transistor 404 is coupled to the first digital input terminal 205. The second current terminal 404C of the first transistor 404 is coupled to the current source 402 and the second current terminal 406C of the second transistor 406. The first transistor 404 is configured to be enabled based on the first digital input terminal 205. The first transistor 404 is a P-channel MOSFET. Alternatively, the first transistor 404 may be a P-channel FET, a P-channel IGBT, a P-channel JFET, an PNP BJT and/or, with slight modifications, a n-type equivalent device.

A first current terminal 406A of the second transistor 406 is coupled to a first current terminal 410A of the fourth transistor 410. A control terminal 406B of the second transistor 406 is coupled to the second digital input terminal 210. The second current terminal 406C of the second transistor 406 is coupled to the current source 402 and the second current terminal 404C of the first transistor 404. The second transistor 406 is configured to be enabled based on the second digital input terminal 210. The second transistor 406 is a P-channel MOSFET. Alternatively, the second transistor 406 may be a P-channel FET, a P-channel IGBT, a P-channel JFET, an PNP BJT and/or, with slight modifications, a n-type equivalent device.

The first current terminal 408A of the third transistor 408 is coupled to the first current terminal 404A of the first transistor 404 and a control terminal 408B of the third transistor 408. A second current terminal 408C of the third transistor 408 is coupled to common potential (e.g., ground). The third transistor 408 is configured to be enabled based on the first transistor 404, such that the third transistor 408 is enabled as the result of the first transistor 404 being enabled by the first digital input terminal 205. The third transistor 408 is a N-channel MOSFET. Alternatively, the third transistor 408 may be an N-channel FET, an N-channel IGBT, an N-channel JFET, an NPN BJT and/or, with slight modifications, a p-type equivalent device.

The first current terminal 410A of the fourth transistor 410 is coupled to the first current terminal 406A of the second transistor 406 and a control terminal 410B of the fourth transistor 410. A second current terminal 410C of the fourth transistor 410 is coupled to common potential (e.g., ground). The fourth transistor 410 is configured to be enabled based on the second transistor 406, such that the fourth transistor 410 is enabled as the result of the second transistor 406 being enabled by the second digital input terminal 210. The fourth transistor 410 is a N-channel MOSFET. Alternatively, the fourth transistor 410 may be an N-channel FET, an N-channel IGBT, an N-channel JFET, an NPN BJT and/or, with slight modifications, a p-type equivalent device.

In the example of FIG. 4, the level shifter circuitry 220 includes a fifth transistor 412, an example first capacitor 414, an example first resistor 416, a sixth transistor 418, an example low-dropout (LDO) regulator 420, a seventh transistor 422, a second resistor 424, an eighth transistor 426, and a second capacitor 428. The level shifter circuitry 220 is configured to generate a digital output signal on the digital signal terminals 325 and 335, such that the signals at the digital signal terminals 325 and 335 are between a minimum and maximum voltage.

A first current terminal 412A of the fifth transistor 412 is coupled to the first capacitor 414, the first resistor 416, and a first current terminal 418A of the sixth transistor 418. A control terminal 412B of the fifth transistor 412 is coupled to the first current terminal 410A of the fourth transistor 410 and the control terminal 410B of the fourth transistor 410. A second current terminal 412C of the fifth transistor 412 is coupled to a common potential (e.g., ground). The fifth transistor 412 is configured to be enabled based on the second transistor 406, such that the fifth transistor 412 is enabled as the result of the second transistor 406 being enabled by the second digital input terminal 210. The fifth transistor 412 is a N-channel MOSFET. Alternatively, the fifth transistor 412 may be an N-channel FET, an N-channel IGBT, an N-channel JFET, an NPN BJT and/or, with slight modifications, a p-type equivalent device.

The first capacitor 414 is coupled between the first current terminal 408A of the third transistor 408 and the first current terminal 412A of the fifth transistor 412. The first capacitor 414 is configured to isolate the current flowing through the third transistor 408 from the current flowing through the fifth transistor 412.

The first resistor 416 is coupled between the first current terminal 412A of the fifth transistor 412 and the LDO regulator 420. The first resistor 416 is configured to generate a difference in voltage between the first current terminal 412A of the fifth transistor 412 and the LDO regulator 420. The magnitude of the first resistor 416 may be determined based on the magnitude of current flowing through the fifth transistor 412.

The first current terminal 418A of the sixth transistor 418 is coupled to the first digital input terminal 325, the first current terminal 412A of the fifth transistor 412, the first capacitor 414, the first resistor 416, and a control terminal 422B of the seventh transistor 422. A control terminal 418B of the sixth transistor 418 is coupled to the second digital input terminal 335, a first current terminal 422A of the seventh transistor 422, the second resistor 424, a first current terminal 426A of the eighth transistor 426, and the second capacitor 428. The sixth transistor 418 is configured to short the first resistor 416 as the result of disabling the eighth transistor 426. The sixth transistor 418 is a P-channel MOSFET. Alternatively, the sixth transistor 418 may be a P-channel FET, a P-channel IGBT, a P-channel JFET, an PNP BJT and/or, with slight modifications, a n-type equivalent device.

The LDO regulator 420 is coupled to the resistors 416 and 424, the second current terminal 418C of the sixth transistor 418, and a second current terminal 422C of the seventh transistor 422. The LDO regulator 420 is configured to supply a supply voltage (Woo), such that the magnitude of the resistors 416 and 424 may be configured to set the digital signal terminals 325 and 335. For example, the inverse of the transconductance of the fifth transistor 412 and the magnitude of the first resistor 416 are configured, such that the first digital input terminal 325 is equal to the first bias voltage plus the second bias voltage generated by the current sources 305 and 340 and the transistors 315 and 345. Advantageously, the LDO regulator 420 is configured to set a magnitude of the voltage of the digital signal terminals 325 and 335.

The first current terminal 422A of the seventh transistor 422 is coupled to the second digital input terminal 335, the control terminal 418B of the sixth transistor 418, the second resistor 424, and the first current terminal 426A of the eighth transistor 426. The control terminal 422B of the seventh transistor 422 is coupled to the first digital input terminal 325, the first current terminal 412A of the fifth transistor 412, the first capacitor 414, the first resistor 416, and the first current terminal 418A of the sixth transistor 418. The second current terminal 422C of the seventh transistor is coupled to the resistors 416 and 424, the second current terminal 418C of the sixth transistor 418, and the LDO regulator 420. The seventh transistor 422 is coupled in parallel with the second resistor 424. The seventh transistor 422 is configured to be enabled as the result of disabling the fifth transistor 412. The seventh transistor 422 is configured to set the second digital input terminal 335 based on the transistors 426 and 412. For example, the second digital input terminal 335 is configured to a logic high as the result of enabling the eighth transistor 426 to disable the sixth transistor 418 and enable the seventh transistor 422. The seventh transistor 422 is a P-channel MOSFET. Alternatively, the seventh transistor 422 may be a P-channel FET, a P-channel IGBT, a P-channel JFET, an PNP BJT and/or, with slight modifications, a n-type equivalent device.

The first current terminal 426A of the eighth transistor 426 is coupled to the second digital input terminal 335, the control terminal 418B of the sixth transistor 418, the first current terminal 422A of the seventh transistor 422, the second resistor 424, and the second capacitor 428. A control terminal 426B of the eighth transistor 426 is coupled to the first current terminal 404A of the first transistor 404, the terminals 408A and 408B of the third transistor 408, and the first capacitor 414. A second current terminal 426C of the eighth transistor 426 is coupled to common potential (e.g., ground). The eighth transistor 426 is configured to be enabled based on the first transistor 404, such that the eighth transistor 426 is enabled as the result of the first transistor 404 being enabled by the first digital input terminal 205. Additionally, the eighth transistor 426 is configured to disable the sixth transistor 418 as a result of being enabled. For example, the eighth transistor 426 is enabled as a result of the first digital input terminal 205 enabling the first transistor 404. The eighth transistor 426 is a N-channel MOSFET. Alternatively, the eighth transistor 426 may be an N-channel FET, an N-channel IGBT, an N-channel JFET, an NPN BJT and/or, with slight modifications, a p-type equivalent device. Advantageously, the eighth transistor 426 may be enabled to set the second digital input terminal 335 at approximately (preferably the exactly) the same time as the eighth transistor 426 enables the sixth transistor 418.

The second capacitor 428 is coupled between the first current terminal 408A of the third transistor 408 and the first current terminal 426A of the eighth transistor 426. The second capacitor 428 is configured to isolate the current flowing through the third transistor 408 from the current flowing through the eighth transistor 426.

In example operation, the current mirror circuitry 215 is configured to receive a differential digital input signal at the digital input terminals 205 and 210, such that the signals coupled to the digital input terminals 205 and 210 are complementary signals. Alternatively, the current mirror circuitry 215 may be modified to be configured for single ended operation. The digital input terminals 205 and 210 are configured to control the transistors 404 and 406, such that a logic low or high may enable or disable the transistors 404 and 406. For example, the first digital input terminal 205 enables the first transistor 404 as the result of a logic low. Alternatively, the first transistor 404 may be replaced with a n-channel MOSFET, such that the first transistor 404 is enabled as a result of the first digital input terminal 205 being a logic high.

The transistors 408 and 410 are configured to be enabled as a result of enabling the transistors 404 or 406. For example, the first transistor 404 enables the third transistor 408 as a result of the first digital input terminal 205 enabling the first transistor 404. The transistors 408 and 410 are configured to control the transistors 412 and 426, such that the third transistor 408 may enable the fifth transistor 412 and the fourth transistor 410 may enable the eighth transistor 426. For example, the fourth transistor 410 enables the fifth transistor 412 as a result of the second transistor 406 enabling the fourth transistor 410. Advantageously, the current mirror circuitry 215 enables the transistors 412 and 426, such that the current flowing through the current terminals is equal to the current flowing through the current terminals of the transistors 408 and 410.

The level shifter circuitry 220 is coupled to the current mirror circuitry 215, such that the current mirror circuitry 215 may enable the transistors 412 and 426 based on the digital input terminals 205 and 210. The level shifter circuitry 220 is configured to shift the voltage level of the digital signal terminals 325 and 335 based on the resistors 416 and 424, and the LDO regulator 420. The level shifter circuitry 220 is configured to set the first digital input terminal 325 to a logic low of a first reference voltage based on the fifth transistor 412, such that a magnitude of the current flowing through the fifth transistor 412 multiplied by the inverse of the transconductance of the fifth transistor 412 is equal to the voltage level representing a logic low. The fifth transistor 412 is configured as a voltage divider, such that the inverse of the transconductance and a magnitude of the first resistor 416 may determine the voltage representing the logic low. For example, a logic low may be equal to 0.5 volts as a result of the LDO regulator 420 being equal to approximately 2 volts, a magnitude of the first resistor 416 equal to 150 ohms, and the fifth transistor 412 having a transconductance of 20 milli siemens. Advantageously, the minimum voltage of the digital signal terminals 325 and 335 may be shifted based on the value of the LDO regulator 420, the transconductance of the transistors 412 and 426, and the resistors 416 and 424.

The level shifter circuitry 220 is configured to enable the transistors 418 and 422 based on the transistors 412 or 426, such that the sixth transistor 418 is enabled as a result of enabling the eighth transistor 426 and the seventh transistor 422 is enabled as a result of enabling the fifth transistor 412. The transistors 418 and 422 are configured to set the digital signal terminals 325 and 335 to a logic high, by coupling the LDO regulator 420 to the digital signal terminals 325 and 335 as a result of enabling the transistors 412 or 426. For example, the second digital input terminal 335 is coupled to the LDO regulator 420 as a result of the current mirror circuitry 215 enabling the fifth transistor 412. Advantageously, the maximum voltage of the digital signal terminals 325 and 335 may be modified based on the value of the LDO regulator 420. Advantageously, the level shifter circuitry 220 is configured to enable the transistors 418 or 422 at approximately (preferably exactly) the same time as the level shifter circuitry 220 disables the transistors 418 or 422. Advantageously, the digital signal terminals 325 and 335 are configured to represent a logic high by setting the digital signal terminals 325 and 335 to the voltage of the LDO regulator 420 and a logic low by setting the digital signal terminals 325 and 335 to the voltage determined by the components of the level shifter circuitry 220.

Figure 5:
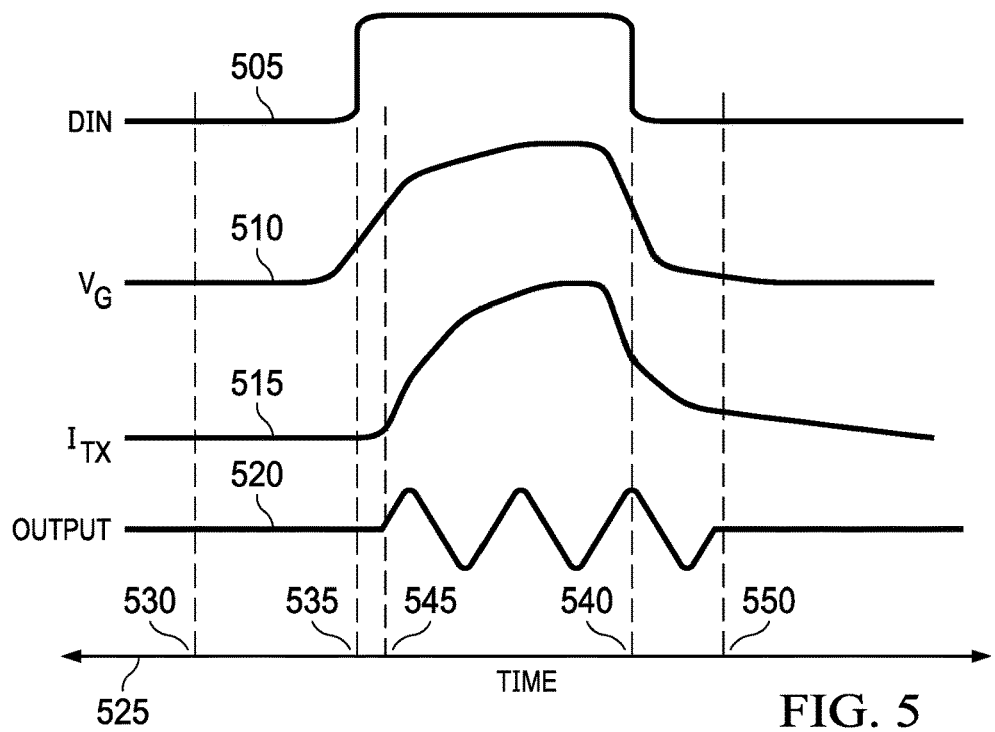
FIG. 5 is an example signal diagram (over time) of an example operation of the OOK modulation circuitry of FIG. 2 including an example digital input signal, an example gate voltage, an example carrier signal current, and an example modulated carrier signal.

FIG. 5 is an example signal diagram including an example digital input signal (DIN) 505, an example gate voltage (VG) line 510, an example carrier signal current ($I_{TX}$) line 515, and an example modulated carrier signal 520 over time. In the example of FIG. 5, the digital input signal 505 represents the digital input terminals (e.g., the digital input terminals 205 and 210 of FIGS. 2 and 4, and the digital signal terminals 325 and 335 of FIGS. 3 and 4) over a sample time represented by the time axis 525. The digital input signal 505 represents a logic low from time 530 to time 535. The digital input signal 505 represents a logic high from time 535 to time 540. The digital input signal 505 may be biased by the level shifter circuitry 220 of FIGS. 2 and 4, such that the logic high and a logic low may be any voltage above common potential (e. g., ground).

The gate voltage line 510 represents the voltage of the control terminal 350B of the fifth transistor 350 of FIG. 3 over the time axis 525. The gate voltage line 510 begins to increase at approximately time 535 as a response to the digital input signal 505 representing a logic high. The gate voltage line 510 approaches a maximum voltage of the gate voltage line 510 similar to that of a logarithmic curve, such that the control terminal 350B of the fifth transistor 350 is enabled shortly after time 535. The magnitude of the voltage of the gate voltage line 510 enables the fifth transistor 350 at time 545. The gate voltage line 510 begins to decrease near time 540, such that the fifth transistor 350 is disabled by time 540. Advantageously, the gate voltage line 510 reaches a voltage magnitude to enable the transistor at time 545.

The carrier signal current line 515 represents the current of the modulated carrier signal generated by the OOK modulator circuitry 225 of FIGS. 2 and 3 at the modulated carrier output terminals 240 and 245 of FIGS. 2 and 3. A magnitude of the current of the modulated the carrier signal is greater than zero as the result of the control terminal 350B enabling the fifth transistor 350 at time 545. The carrier signal current line 515 follows the trend of the gate voltage line 510.

The modulated carrier signal 520 represents the voltage of the modulated carrier signal generated by the OOK modulator circuitry 225 of FIGS. 2 and 3 over the time axis 525. The modulated carrier signal 520 represents a logic low from time 530 to time 545, corresponding to the digital input signal representing a logic low from time 530 to 535. The modulated carrier signal 520 represents a logic high (e.g., a sinusoidal signal with a non-zero magnitude and a frequency that may be the same as the frequency as the signal provided by the oscillator) from time 545 to time 550 corresponding to the logic high of the digital input signal 505 from time 535 to time 540. The current of the modulated carrier signal 520 is represented by the magnitude of the carrier signal current line 515.

Figure 6:
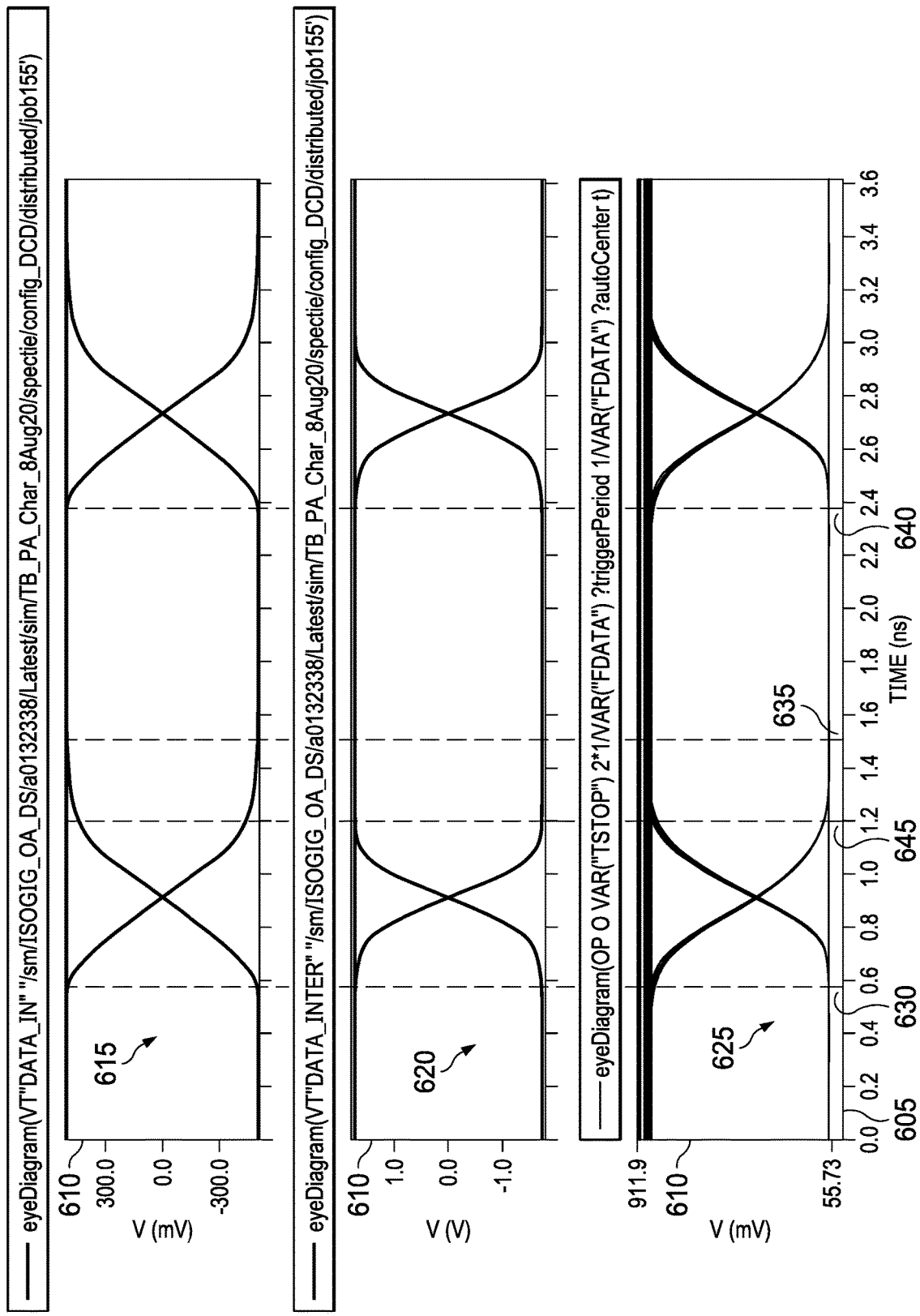
FIG. 6 includes example timing diagrams to illustrate signals through the OOK modulation circuit of FIG. 2 during an example operation.

FIG. 6 includes example timing diagrams to illustrate signals through the OOK modulation circuit of FIG. 2 during an example operation. In the example of FIG. 6, the timing diagrams include an example time axis 605, an example voltage axis 610, an example first eye diagram 615, a second eye diagram 620, and a third eye diagram 625.

The first eye diagram 615 represents the eye closure of the current generated by the current mirror circuitry 215 of FIGS. 2 and 4. The first eye diagram 615 represents the magnitude of the voltage of the signals at the first current terminals 408A and 410A of transistors 408 and 410 of FIG. 4 over time. The first eye diagram 615 transitions from a maximum voltage at time 630 to a minimum voltage at time 635. The first eye diagram 615 remains at the minimum and maximum voltages from approximately time 635 to time 640. The duration that the first eye diagram 615 remains at maximum is approximately 2.5 nano seconds (nS).

The second eye diagram 620 represents the eye closure of the digital signal terminals 325 and 335 of FIGS. 3 and 4, generated by the level shifter circuitry 220 of FIGS. 2 and 4. The second eye diagram 620 transitions from a maximum voltage at approximately time 630 to a minimum voltage at time 645. The second eye diagram 620 remains at the minimum and maximum voltages from approximately time 645 to time 640. The duration that the second eye diagram 620 remains at the maximum and minimum voltages is approximately 1.15 nS. Advantageously, the level shifter circuitry 220 increases the duration that the second eye diagram remains at the minimum and maximum voltages, such that the ISI of the digital signal terminals 325 and 335 is reduced compared to the ISI of the digital input terminals 205 and 210.

The third eye diagram 625 represents the eye closure of the modulated carrier output terminals 240 and 245 of FIGS. 2 and 3. The third eye diagram 625 transitions from a maximum voltage at approximately time 630 to a minimum voltage at time 645. The third eye diagram 625 remains at the minimum and maximum voltages from approximately time 645 to time 640. The duration that the third eye diagram 625 remains at the maximum and minimum voltages is approximately 1.15 nS. Advantageously, the level shifter circuitry 220 increases the duration that the third eye diagram remains at the minimum and maximum voltages, such that the ISI of the digital signal terminals 325 and 335 is reduced compared to the ISI of the digital input terminals 205 and 210.

Figure 7A:
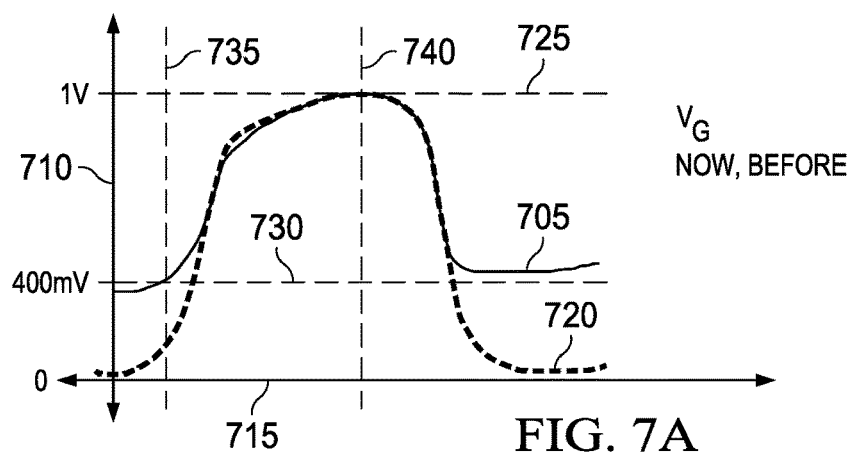
FIG. 7A is an example timing diagram of an example gate voltage of the OOK modulation circuit of FIG. 2 during example operation.

FIG. 7A is an example timing diagram of an example gate voltage 705 of the OOK modulator circuitry 225 of FIGS. 2 and 3 during example operation. In the example of FIG. 7A, the gate voltage 705 is represented as a voltage of an example voltage axis 710 over time of an example time axis 715. The timing diagram of FIG. 7A includes the gate voltage 705, an example conventional gate voltage plot 720, an example first bias voltage 725, and a second bias voltage 730.

The gate voltage 705 represents the voltage of the control terminal 350B of the fifth transistor 350 of FIG. 3 over time. The gate voltage 705 represents the circuitry of the OOK modulator circuitry 225 of FIGS. 2 and 3, enabling the fifth transistor 350 as a result of a logic high on the digital input signal at the digital signal terminals 325 and 335.

The first bias voltage 725 represents the first bias voltage generated by the first current source 305 of FIG. 3 and the first transistor 315 of FIG. 3. The first bias voltage 725 may be configured to be any voltage greater than a voltage threshold of the fifth transistor 350, such that the fifth transistor 350 may be enabled as the result of enabling the second transistor 320 of FIG. 3.

The second bias voltage 730 represents the second bias voltage generated by the second current source 340 of FIG. 3 and the fourth transistor 345 of FIG. 3. The second bias voltage 730 may be configured to be any voltage less than the voltage threshold of the fifth transistor 350, such that the fifth transistor 350 may be disabled as the result of enabling the third transistor 330 of FIG. 3.

The gate voltage 705 begins at the second bias voltage 730 to generate a modulated carrier signal representing a logic low. The gate voltage 705 increases towards the first bias voltage 725 to indicate a logic high. At time 740 the gate voltage 705 is approximately equal to the first bias voltage 725. The gate voltage 705 decreases towards the second bias voltage 730 at approximately time 740. The conventional gate voltage 720 increases from common potential (e.g., ground) towards the first bias voltage 725. The gate voltage 705 and the conventional gate voltage 720 are approximately equal between the bias voltages 725 and 730. Advantageously, the OOK modulator circuitry 225 of FIGS. 2 and 3 is able to enable the fifth transistor 350 faster than a conventional OOK modulator (such as the conventional OOK modulator of FIG. 9). Advantageously, the OOK modulator circuitry 225 of FIGS. 2 and 3 exhibits reduced rise and fall durations of the gate voltage of the control terminal 350B of the fifth transistor 350 compared to a conventional OOK modulator.

Figure 7B:
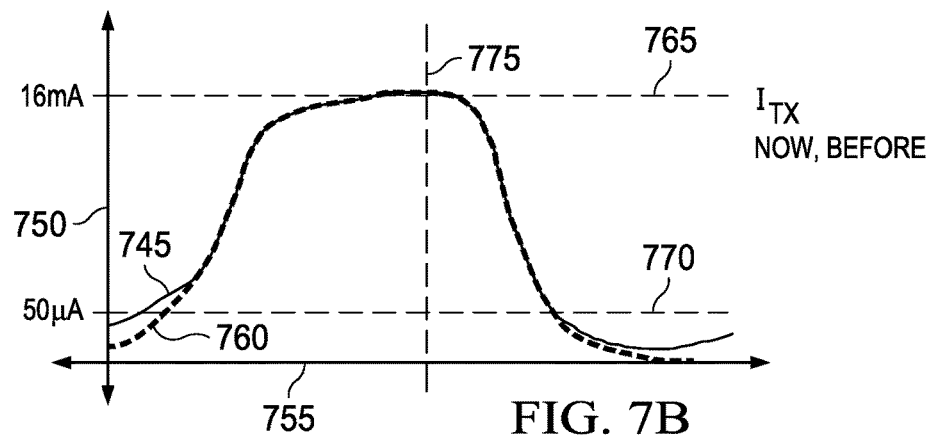
FIG. 7B is an example timing diagram of an example carrier signal current of the OOK modulation circuit of FIG. 2 during example operation.

FIG. 7B is an example timing diagram of an example carrier signal current 745 of the OOK modulator circuitry 225 of FIGS. 2 and 3 during example operation. In the example of FIG. 7B, the carrier signal current 745 is represented as a current of an example current axis 750 over time of an example time axis 755. The timing diagram of FIG. 7B includes the carrier signal current 745 of the OOK modulator circuitry 225 of FIGS. 2 and 3, an example conventional carrier signal current 760, an example first bias current 765, and a second bias current 770.

The carrier signal current 745 represents the current flowing through the current terminals 330A and 330C of the fifth transistor 350 of FIG. 3 over time. The carrier signal current 745 represents the circuitry of the OOK modulator circuitry 225 of FIGS. 2 and 3, enabling the fifth transistor 350 as a result of a logic high on the digital input signal at the digital signal terminals 325 and 335.

The first bias current 765 represents a current representation of the first bias voltage generated by the first current source 305 of FIG. 3 and the first transistor 315 of FIG. 3. The first bias current 765 may be configured to be any current to generate a voltage greater than a voltage threshold of the fifth transistor 350, such that the fifth transistor 350 may be enabled as the result of enabling the second transistor 320 of FIG. 3.

The second bias current 770 represents a current representation of the second bias voltage generated by the second current source 340 of FIG. 3 and the fourth transistor 345 of FIG. 3. The second bias current 770 may be configured to be any current that generates a voltage less than the voltage threshold of the fifth transistor 350, such that the fifth transistor 350 may be disabled as the result of enabling the third transistor 330 of FIG. 3.

The carrier signal current 745 begins at the second bias current 770 to generate a modulated carrier signal representing a logic low. The carrier signal current 745 increases towards the first bias current 765 to indicate a logic high. At time 775 the carrier signal current 745 is approximately equal to the first bias current 765. The carrier signal current 745 decreases towards the second bias current 770 at approximately time 775. The conventional carrier signal current 760 increases from common potential (e.g., ground) towards the first bias current 765. The carrier signal current 745 and the conventional carrier signal current 760 are approximately equal between the bias currents 765 and 770. Advantageously, the OOK modulator circuitry 225 of FIGS. 2 and 3 increases the current of the carrier signal current 745 less than the conventional carrier signal current 760.

Figure 8:
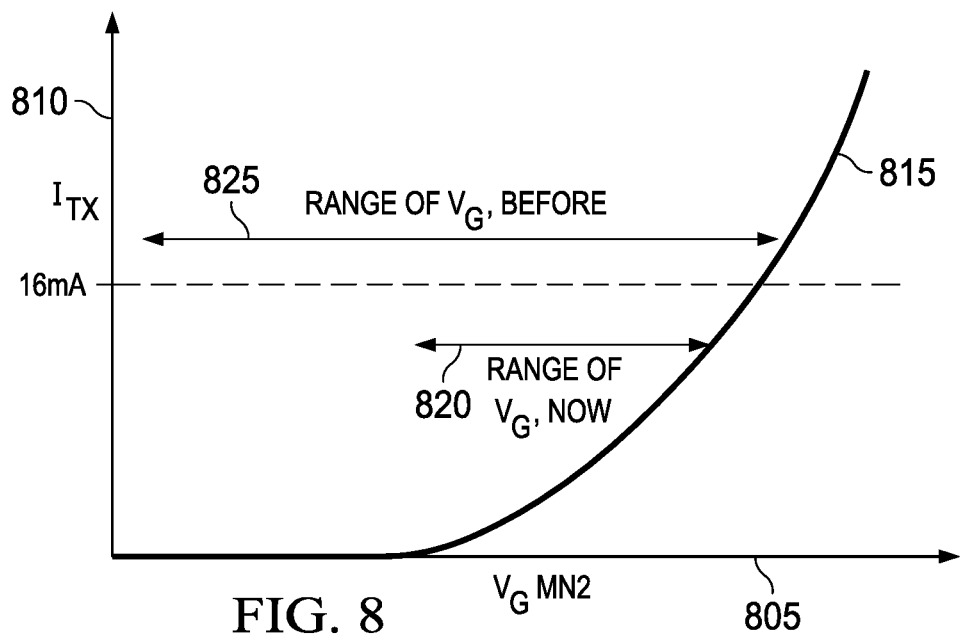
FIG. 8 is an example diagram illustrating an example gate voltage versus an example carrier signal current of the OOK modulation circuit of FIG. 2 during example operation.

FIG. 8 is an example diagram illustrating an example gate voltage versus an example carrier signal current of the OOK modulator circuitry 225 of FIGS. 2 and 3 during example operation. In the example of FIG. 8, the diagram includes an example gate voltage axis 805, an example carrier current axis 810, and an example operation line 815. The gate voltage axis 805 represents the voltage of the control terminal 350B of the fifth transistor 350 of FIG. 3. The carrier current axis 810 represents the current flowing through current terminals 350A and 350C of the fifth transistor 350. The carrier current axis 810 is approximately equal to the current of the modulated carrier signal generated by the OOK modulator circuitry 225. The operation line 815 represents how a change in the voltage of the control terminal 350C of the fifth transistor 350 changes the carrier current. An example first range 820 depicts the difference in the voltage of the control terminal 350B of the fifth transistor 350. A second range 825 depicts the difference in the voltage of the gate voltage of a conventional OOK modulator (e.g., the conventional OOK modulator of FIG. 9). Advantageously, the range of the gate voltage of the OOK modulator circuitry 225 is reduced compared to the conventional OOK modulator of FIG. 9, such that the OOK modulator circuitry 225 exhibits less ISI as the result of the ability to enable the fifth transistor 350 over a smaller voltage increase.

Figure 9:
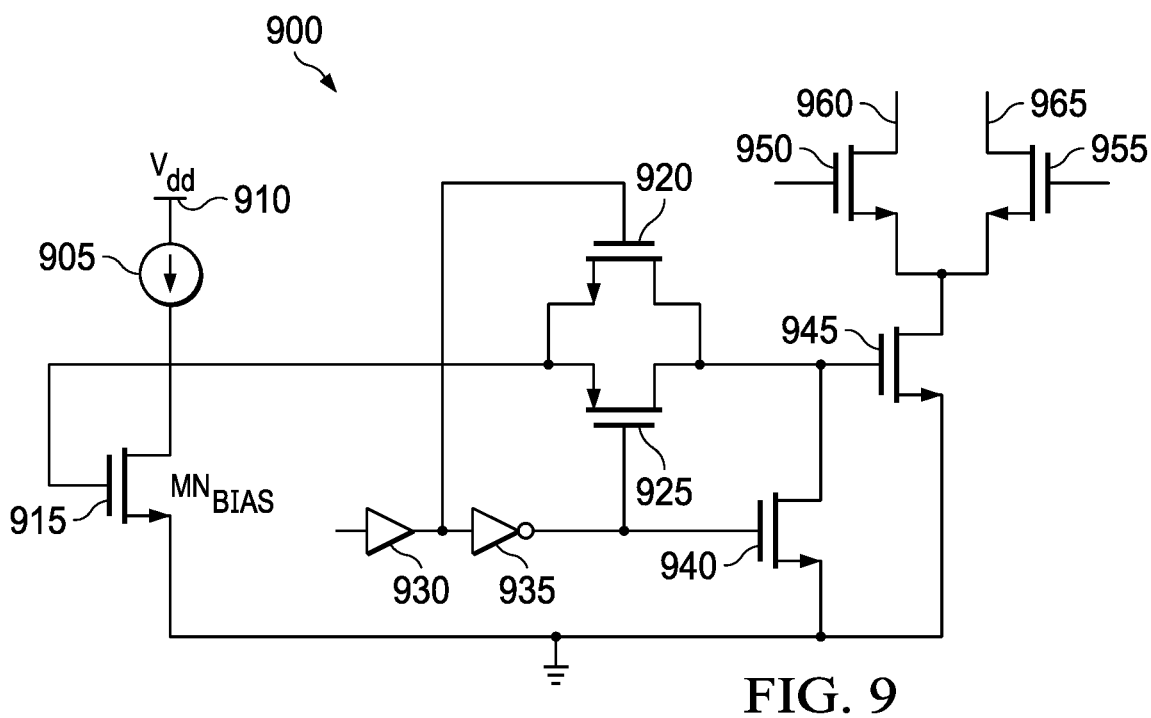
FIG. 9 is a schematic diagram of a conventional OOK modulation circuit.

FIG. 9 is a schematic diagram of an example conventional OOK modulator 900. The conventional OOK modulator 900 includes a current source 905, a supply voltage ($V_{dd}$) 910, a first transistor 915, a second transistor 920, a third transistor 925, a buffer 930, an inverter 935, a fourth transistor 940, a fifth transistor 945, a sixth transistor 950, a seventh transistor 955, a first modulated output terminal 960, and a second modulated output terminal 965. In the example of FIG. 9, the conventional OOK modulator 900 is configured to convert a digital input signal coupled to the buffer 930 to generate a modulated carrier signal on the modulated output terminals 960 and 965.

In the example of FIG. 9, the current source 905 is coupled between the supply voltage 910 and the first transistor 915. The first transistor 915 is coupled between the current source 905 and common potential (e.g., ground). The first transistor 915 is configured to generate a bias voltage based on a magnitude of current from the current source 905. The first transistor 915 is coupled to the transistors 920 and 925. The transistors 920 and 925 are coupled in parallel, such that a current may flow through either of the transistor 920 or 925 to contribute to the current generated by the current source 905. The second transistor 920 is configured to be controlled by an output of the buffer 930, such that the second transistor 920 is enabled as a result of a logic high on an input of the buffer 930. The third transistor 925 is configured to be controlled by an output of the inverter 935, such that third transistor 925 is enabled by a logic low on an input of the inverter 935. The inverter 935 is coupled to the buffer 930. The inverter 935 is configured to control the transistors 925 and 940. The fourth transistor 940 is coupled between the transistors 920 and 925, and common potential. The fourth transistor 940 is configured to control the fifth transistor 945, such that fifth transistor 945 is disabled as the result of enabling the fourth transistor 940. The fifth transistor 945 is coupled between the transistors 950 and 955, and common potential. The fifth transistor 945 is configured to enable the transistors 950 and 955 to generate a modulated carrier signal. The fifth transistor 945 may be enabled by enabling the second transistor 920, such that the bias voltage generated by the current source 905 and the first transistor 915 is coupled to the fifth transistor 945. The sixth transistor 950 is coupled between the fifth transistor 945 and the first modulated output terminal 960. The sixth transistor 950 is configured to be controlled by an output of an oscillator, such that the sixth transistor 950 generates a signal similar to that of the output of the oscillator as the result of enabling the fifth transistor 945. The seventh transistor 955 is coupled between the fifth transistor 945 and the second modulated output terminal 965. The seventh transistor 955 is configured to be controlled by an output of an oscillator, such that the seventh transistor 955 generates a signal similar to that of the output of the oscillator as the result of enabling the fifth transistor 945.

In example operation, the conventional OOK modulator 900 generates a modulated carrier signal on the modulated output terminals 960 and 965 based on a digital input signal coupled to the input of the buffer 930. The buffer 930 controls the second transistor 920, such that a logic high on the digital input signal may enable the second transistor 920. The fifth transistor 945 is enabled based on the bias voltage, generated by the first transistor 915 and the current source 905, being coupled by the second transistor 920 to the fifth transistor 945.

The inverter 935 may disable the fifth transistor 945 as a result of enabling the fourth transistor 940. The fourth transistor 940 is configured to couple the fifth transistor 945 to common potential, such that the fifth transistor 945 may not be enabled.

In example operation, the fifth transistor 945 is enabled based on a logic high on the digital input signal. The fifth transistor 945 is disabled based on a logic low on the digital input signal. The fifth transistor 945 is controlled by the transistors 920, 925, and 940, such that the voltage configured to control the fifth transistor 945 is between common potential and the bias voltage. Advantageously, the OOK modulator circuitry 225 of FIGS. 2 and 3 is configured to couple a voltage between a first bias voltage and a second bias voltage to control the fifth transistor 350. Alternatively, the current mirror circuitry 215 of FIGS. 2 and 4 and the level shifter circuitry 220 of FIGS. 2 and 4 may be coupled to the input of the buffer 930.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board Uses of the phrase "ground" in the foregoing description include a chassis ground, an Earth ground, a floating ground, a virtual ground, a digital ground, a common ground, and/or any other form of ground connection applicable to, or suitable for, the teachings of this description. As used herein, "common potential" may refer to a potential (such as ground potential) on one or both side of the isolation barrier. The "common potential" on one side of the isolation barrier may be at a different potential than the "common potential" on the other side of the isolation barrier. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. An apparatus comprising:
    an on-off keying (OOK) modulator including:
        a first transistor including a first control terminal;
        a second transistor including a first current terminal, a second current terminal, and a second control terminal, the first current terminal coupled to the first control terminal;
        a third transistor including a third current terminal, a fourth current terminal, and a third control terminal, the third current terminal coupled to the first control terminal;
        a fourth transistor including a fourth control terminal, the fourth control terminal coupled to the second current terminal; and
        a fifth transistor including a fifth control terminal, the fifth control terminal coupled to the fourth current terminal.

2. The apparatus of claim 1, wherein the apparatus further includes a level shifting circuit including a resistor coupled in parallel to a sixth transistor, the sixth transistor coupled to the third transistor and configured to short the resistor as a result of being enabled.

3. The apparatus of claim 1, wherein the OOK modulator is coupled to an oscillator, the oscillator is configured to control a transistor to generate a modulated carrier signal as a result of controlling the first transistor based on a digital input signal.

4. The apparatus of claim 1, wherein the first transistor is an N-channel metal-oxide-semiconductor field-effect transistor including the first control terminal as a gate terminal.

5. The apparatus of claim 1, wherein the second transistor is a N-channel metal-oxide-semiconductor field-effect transistor including the second control terminal as a gate terminal, the first current terminal as a source terminal, and the second current terminal as a drain terminal.

6. The apparatus of claim 1, wherein the third transistor is a N-channel metal-oxide-semiconductor field-effect transistor including the third control terminal as a gate terminal, the third current terminal as a drain terminal, and the fourth current terminal as a source terminal.

7. The apparatus of claim 1, wherein the fourth transistor is configured to generate a bias voltage to be applied to the first control terminal as a result of enabling the second transistor.

8. The apparatus of claim 1, wherein the fifth transistor is configured to generate a bias voltage to be applied to the first control terminal as a result of enabling the third transistor.

9. A system comprising:
a level shifting circuit configured to generate a digital output based on a digital input, wherein voltage level of the digital output is shifter from voltage level of the digital input; and
an on-off keying (OOK) modulator coupled to the level shifting circuit, circuit and comprising:
a first transistor having a first terminal and a second terminal, wherein the first terminal is coupled to a first bias voltage;
a second transistor having a third terminal and a fourth terminal, wherein the third terminal is coupled to a second bias voltage; and
a third transistor having a control terminal coupled to the second terminal of the first transistor and the fourth terminal of the second transistor, wherein
the OOK modulator configured to:
turn on the first transistor to apply the first bias voltage to the control terminal of the third transistor in response to a first state of the digital output;
turn on the second transistor to apply the second bias voltage to the control terminal of the third transistor in response to a second state of the digital output which is opposite to the first state;
generate a current through the third transistor based on the voltage applied to the control terminal of the third transistor; and
generate a modulated carrier signal based on an output of an oscillator and the current through the third transistor.

10. The system of claim 9, wherein the system further includes a current mirror including an output, the output is coupled to the digital input.

11. The system of claim 9, wherein that the level shifting circuit includes a first switch and a second switch, in which the first switch is configured to be enabled by the first state of the digital output, and the second switch is configured to be enabled by the second state of the digital output.

12. The system of claim 9, wherein the OOK modulator is further configured to disable the third transistor as a result of coupling the second bias voltage to the control terminal.

13. The system of claim 9, wherein the OOK modulator is further configured to provide the first bias voltage to the control terminal of the third transistor based on a bias current, the first bias voltage is configured to enable the third transistor.

14. The system of claim 9, wherein the OOK modulator is further configured to provide the second bias voltage to the control terminal of the third transistor based on a bias current, the second bias voltage is set at voltage magnitude smaller than a threshold voltage of the third transistor but higher than a ground level and configured to disable the third transistor.

15. A method comprising:
providing a first bias voltage at a control terminal of a transistor through a first transistor when a digital output is in a first state;
providing a second bias voltage at the control terminal of the transistor through a second transistor when the digital output is in a second state;
generating a current through the transistor based on voltage at the control terminal of the transistor; and
generating a modulated carrier signal based on an output of an oscillator and the current through the transistor.

16. The method of claim 15, wherein the voltage coupled to the control terminal of the transistor is of a range of a first bias voltage to a second bias voltage, the control terminal enables the transistor as a result of a voltage in the range being coupled to the control terminal.

17. The method of claim 15, wherein the transistor is a primary transistor, the first bias voltage is determined based on a current flowing through a secondary transistor, the secondary transistor is configured to generate the first bias voltage coupled to the control terminal.

18. The method of claim 15, wherein the transistor is a primary transistor, the second bias voltage is determined based on a current flowing through a secondary transistor, the secondary transistor is configured to generate the second bias voltage coupled to the control terminal.

19. The method of claim 15, wherein the current generated by the transistor is configured to be controlled by a differential output of the oscillator.

* * * * *